(12) United States Patent
Fukazawa et al.

(10) Patent No.: US 8,722,546 B2
(45) Date of Patent: May 13, 2014

(54) METHOD FOR FORMING SILICON-CONTAINING DIELECTRIC FILM BY CYCLIC DEPOSITION WITH SIDE WALL COVERAGE CONTROL

(75) Inventors: Atsuki Fukazawa, Tama (JP); Takahiro Oka, Hino (JP)

(73) Assignee: ASM IP Holding B.V., Almere (NL)

( * ) Notice: Subject to any disclaimer, the term of this patent is extended or adjusted under 35 U.S.C. 154(b) by 67 days.

(21) Appl. No.: 13/493,897

(22) Filed: Jun. 11, 2012

(65) Prior Publication Data

US 2013/0330933 A1  Dec. 12, 2013

(51) Int. Cl.
*H01L 21/00* (2006.01)
(52) U.S. Cl.
USPC .................. 438/778; 438/758; 257/E21.001
(58) Field of Classification Search
USPC .......................................................... 438/778
See application file for complete search history.

(56) References Cited

U.S. PATENT DOCUMENTS

| | | | |
|---|---|---|---|
| 2010/0124618 A1* | 5/2010 | Kobayashi et al. | 427/535 |
| 2010/0124621 A1* | 5/2010 | Kobayashi et al. | 427/579 |
| 2010/0255218 A1* | 10/2010 | Oka et al. | 427/579 |
| 2012/0028469 A1* | 2/2012 | Onizawa et al. | 438/694 |
| 2013/0019944 A1* | 1/2013 | Hekmatshoar-Tabari et al. | 136/258 |
| 2013/0019945 A1* | 1/2013 | Hekmatshoar-Tabari et al. | 136/258 |
| 2013/0084714 A1* | 4/2013 | Oka et al. | 438/765 |
| 2013/0224964 A1* | 8/2013 | Fukazawa et al. | 438/765 |

\* cited by examiner

*Primary Examiner* — Seahvosh Nikmanesh
*Assistant Examiner* — Evren Seven
(74) *Attorney, Agent, or Firm* — Snell & Wilmer L.L.P.

(57) ABSTRACT

A method of forming a dielectric film having Si—C bonds and/or Si—N bonds on a semiconductor substrate by cyclic deposition, includes: (i) conducting one or more cycles of cyclic deposition in a reaction space wherein a semiconductor substrate is placed, using a Si-containing precursor and a reactant gas; and (ii) before or after step (i), applying a pulse of RF power to the reaction space while supplying a rare gas and a treatment gas without supplying a Si-containing precursor, whereby a dielectric film having Si—C bonds and/or Si—N bonds is formed on the semiconductor substrate.

20 Claims, 3 Drawing Sheets

METHOD FOR FORMING SILICON-CONTAINING DIELECTRIC FILM BY CYCLIC DEPOSITION WITH SIDE WALL COVERAGE CONTROL

BACKGROUND

1. Field of the Invention

The present invention relates generally to semiconductor integrated circuit manufacturing and, more particularly to a method of forming a silicon-containing dielectric film on a semiconductor substrate by cyclic deposition such as atomic layer deposition and cyclic chemical vapor deposition with side wall coverage control.

2. Description of the Related Art

As methods of depositing dielectric films on substrates, typically chemical vapor deposition (CVD) and atomic layer deposition (ALD) are known. A skilled artisan often uses plasma-enhanced CVD (PE-CVD) and plasma-enhanced ALD (PE-ALD) to form dielectric films. PE-ALD is a deposition technology of dielectric films using chemisorption of precursors and can improve a step coverage of films depositing on recess patterns of substrates, as compared with PE-CVD. However, when depositing a dielectric film other than SiO film by PE-ALD on a recess pattern, where nitration or carbon substitution reaction is conducted in an atmosphere with plasma, the thickness of film deposited on a sidewall is sometimes small relative to the thickness of film deposited on a top surface. This problem may be caused by ion collision interfering with reaction speed on the sidewall as compared with that on a top or bottom surface. Particularly, nitration has a low rate of sidewall reaction as compared with oxidation, causing problems of thin film deposited on a sidewall, deterioration of film deposited on a sidewall, etc. Since reactivity of a precursor with a reactant gas affects step coverage and thickness of depositing film, the present inventors have conducted research to improve reactivity inside a recess in not only PE-ALD but also other cyclic deposition methods.

Any discussion of problems and solutions involved in the related art has been included in this disclosure solely for the purposes of providing a context for some, not all, embodiments of the present invention, and it should not be taken as an admission that any or all of the discussion were known at the time the invention was made.

SUMMARY

An embodiment of the present invention provides a method of forming a dielectric film having Si—C bonds and/or Si—N bonds on a semiconductor substrate by cyclic deposition, which comprises:

(i) conducting one or more cycles of cyclic deposition in a reaction space wherein a semiconductor substrate is placed, using a Si-containing precursor and a reactant gas; and (ii) before or after step (i), applying a pulse of RF power to the reaction space while supplying a rare gas and a treatment gas without supplying a Si-containing precursor, whereby a dielectric film having Si—C bonds and/or Si—N bonds is formed on the semiconductor substrate.

In some embodiments, the semiconductor substrate has patterned recesses on which the dielectric film is formed, each patterned recess including a top surface, side wall, and bottom surface, and the dielectric film is formed as a first dielectric film wherein the duration of step (i) is T1, and the duration of step (ii) is T2, said method further comprising:

determining a side wall coverage of the first dielectric film as a first side wall coverage, which side wall coverage is defined as a ratio of thickness of film deposited on the side wall to thickness of film deposited on the top surface; and conduct steps (i) and (ii) to form a second dielectric film having a second side wall coverage on a substrate using T2/T1 which is higher than T2/T1 used for the first dielectric film so as to render the second side wall coverage higher than the first side wall coverage, said second side wall coverage being over 85%.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

Figure 1:
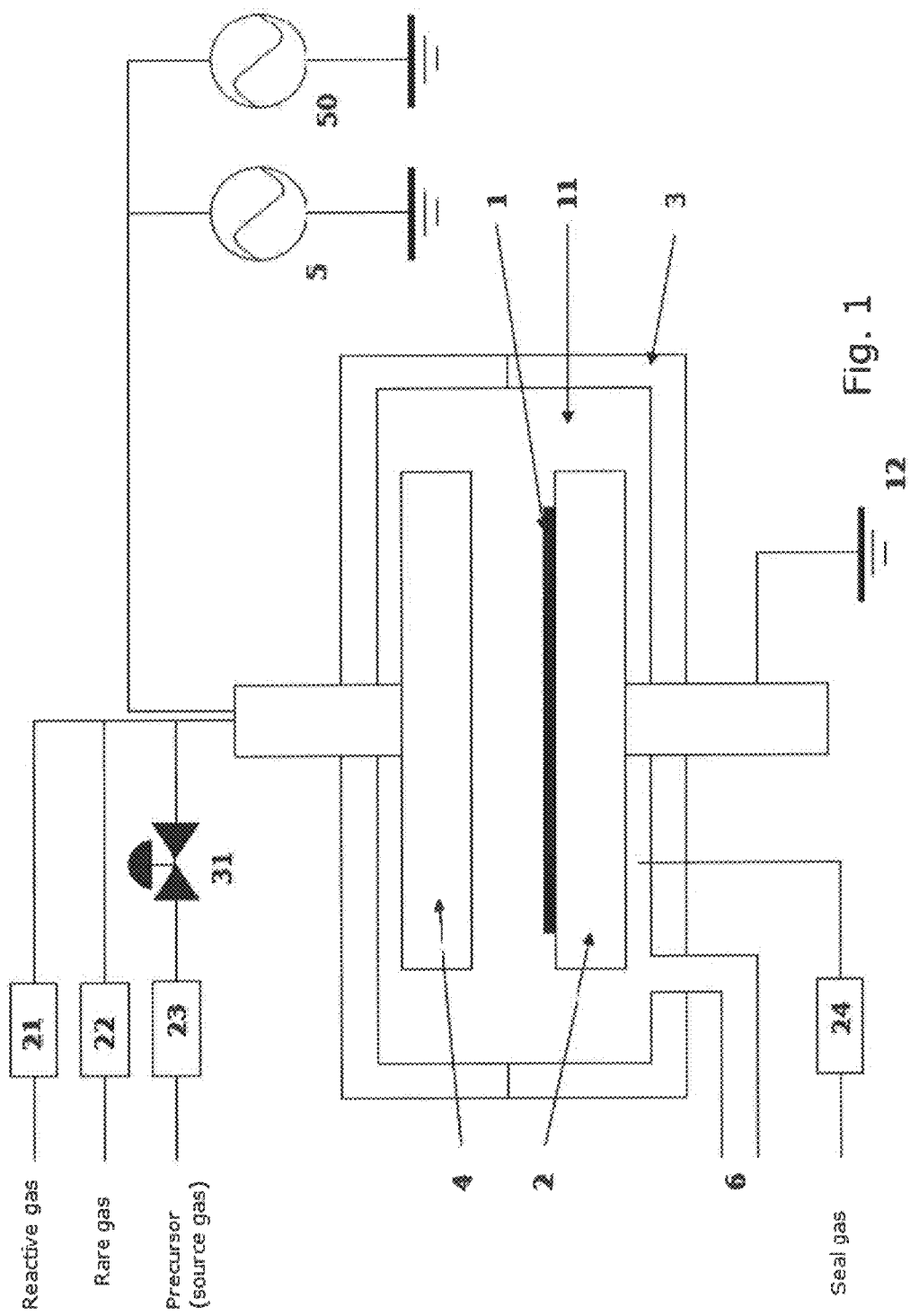
FIG. 1 is a schematic representation of a PE-ALD apparatus for depositing a dielectric film usable in some embodiments of the present invention.

In this disclosure, a "gas" may include vaporized solid and/or liquid and may be constituted by a single gas or a mixture of gases. Likewise, "a" refers to a species or a genus including multiple species. In this disclosure, "a film having Si—C bonds and/or Si—N bonds" may refer to a film characterized by Si—C bonds and/or Si—N bonds, a film constituted mainly or predominantly by Si—C bonds and/or Si—N bonds, a film categorized as Si—C films, Si—N films, or Si—C—N films, and/or a film having a main skeleton substantially constituted by Si—C bonds and/or Si—N bonds.

In this disclosure, the precursor may include a rare gas as a carrier gas when the precursor is vaporized and carried by a rare gas, and the flow of the precursor is controlled by the inflow pressure (the pressure of gas flowing into a reactor). Further, the precursor is a material from which the film is derived and which provides main elements of the film. The precursor contains silicon and can be mixed with a secondary precursor which does not contain silicon such as hydrocarbon gas for a film having Si—C bonds. The reactant gas may be any gas causing surface reaction in an excited state with the precursor chemisorbed on a surface to fix a monolayer of the precursor on the surface by ALD or other cyclic deposition or any gas causing reaction with the precursor in an excited atmosphere to deposit a reaction product on the substrate by CVD or other cyclic deposition. In this disclosure, when two or more steps can continuously be performed, "continuously" refers to without breaking a vacuum, without interruption as a timeline, without changing treatment conditions, immediately thereafter, as a next step, or without a discrete physical or chemical boundary between two structures in some embodiments. In some embodiments, "film" refers to a layer composed of multiple monolayers (composed of the same monolayers or different monolayers) and continuously extending in a direction perpendicular to a thickness direction substantially without pinholes to cover an entire target or concerned surface, or simply a layer covering a target or concerned surface. A film or layer may be constituted by a discrete single film or a layer having a common characteristic. In this disclosure, any defined meanings do not necessarily exclude ordinary and customary meanings in some embodiments.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments.

As described above, in some embodiments, the method of forming a dielectric film having Si—C bonds and/or Si—N bonds on a semiconductor substrate by cyclic deposition, comprises: (i) conducting one or more cycles of cyclic deposition in a reaction space wherein a semiconductor substrate is placed, using a Si-containing precursor and a reactant gas; and (ii) before or after step (i), applying a pulse of RF power to the reaction space while supplying a rare gas and a treatment gas without supplying a Si-containing precursor, whereby a dielectric film having Si—C bonds and/or Si—N bonds is formed on the semiconductor substrate. In this disclosure, step (ii) may be referred to as a "growth control step". By conducting step (ii), a step coverage or conformality of a film can effectively be controlled. In some embodiments, steps (i) and (ii) are repeated alternately to form the dielectric film.

In some embodiments, the semiconductor substrate has patterned recesses on which the dielectric film is formed, each patterned recess including a top surface, side wall, and bottom surface. In some embodiments, the dielectric film has a side wall coverage of typically over 85%, which is defined as a ratio of thickness of film deposited on the side wall to thickness of film deposited on the top surface (e.g., the recess is a Si-line pattern having an opening of 30 to 100 nm and a depth of 200 to 400 nm). In some embodiments, the side wall coverage may be more than 80%, 90% or higher, or 95% or higher. In some embodiments, the side wall coverage is substantially similar (e.g., different by less than 5, 3, or 1 percentage points) to the bottom surface coverage, which is defined as a ratio of thickness of film deposited on the bottom surface to thickness of film deposited on the top surface. The bottom surface coverage may be at least about 85%, 90%, or 95%. In conventional methods, the side wall coverage is normally 10 to 20 percentage points lower than the bottom surface coverage.

In some embodiments, the number of times steps (i) and (ii) are conducted is M, the number of cycles the cyclic deposition is conducted in step (i) is N, and M·N is constant and determined in order to obtain a target thickness of the dielectric film, wherein N is, for example, 1 to 30,000, 1 to 3,000, 1 to 300, or 1 to 30, depending on the characteristics of monolayers of a film wherein a relatively large N may be used for predominantly improving the initial chemical adsorption of a first monolayer, and a relatively small N may be used for predominantly improving the chemical adsorption of each monolayer or every several (or more) monolayers. For example, when M·N is 500, M is 1 and N is 500, M is 500 and N is 1, M is 250 and N is 2, or the like. M and N can be determined by a skilled artisan in view of the present disclosure based on routine experimentations.

In some embodiments, the duration of step (i) is T1, and the duration of step (ii) is T2, wherein T2/T1 is typically about 0.01 to about 0.1. In some embodiments, T2/T1 may be 0.001, 0.01, 0.05, 0.1, 0.2, 0.3, 0.4 or any values within any two of the foregoing numbers.

In some embodiments where the dielectric film is formed as a first dielectric film, any of the disclosed methods further comprises: (a) determining a side wall coverage of the first dielectric film as a first side wall coverage, which side wall coverage is defined as a ratio of thickness of film deposited on the side wall to thickness of film deposited on the top surface; and (b) conduct steps (i) and (ii) to form a second dielectric film having a second side wall coverage on a substrate using T2/T1 which is higher than T2/T1 used for the first dielectric film so as to render the second side wall coverage higher than the first side wall coverage, said second side wall coverage being over 85%. By controlling T2/T1, the side wall coverage can be controlled.

In some embodiments, the cyclic deposition is atomic layer deposition (ALD) such as plasma-enhanced ALD, thermal ALD, or radical-enhanced ALD. In ALD, step (ii) may be conducted before step (i) wherein step (ii), the growth control step, can treat surfaces of the substrate and interfere with chemisorption of the precursor predominantly, selectively, or more likely on the top and bottom surfaces relative to the side wall in step (i) so as to substantially match the chemisorption degree on the side wall with that on the top and bottom surfaces.

In some embodiments, the cyclic deposition is plasma enhanced CVD. In CVD, step (ii) is conducted after step (i) wherein step (ii), the growth control step, can treat surfaces of the substrate and etch predominantly, selectively, or more likely the top and bottom surface relative to the side wall covered with film formed in step (i) so as to substantially match deposition thickness on the side wall with that on the top and bottom surfaces.

In some embodiments, the treatment gas in step (ii) is at least one gas selected from the group consisting of N-containing gases, H-containing gases, and C-containing gases. In some embodiments, the treatment gas is at least one gas selected from the group consisting of $N_2$, $NH_3$, $N_xH_y$, $C_aH_b$, $C_aH_bN_c$, and $H_2$ wherein x, y, z, a, b, and c are integers (e.g., x is one or two, and a is three to six). In some embodiments, the treatment gas and the reactant gas are the same gas. In some embodiments, the reactant gas can be continuously supplied separately from the precursor and/or as a carrier gas of the precursor to a reactor and excited at a specific timing by a plasma, or can be supplied separately from the precursor at a specific timing and/or excited at a specific timing by a plasma. In some embodiments, the reactant gas also functions as a purge gas when the reactant gas is continuously introduced.

In some embodiments, the rare gas (which may be referred to as dilution gas) is at least one rare gas selected from Ar, He, Kr, and Xe. In some embodiments, the rare gas is He. He may be highly effective to increase step coverage.

In step (ii), in some embodiments, the ratio of the treatment gas flow to the rare gas flow is 0.001/1 to 10/1 including 0.1/1, 1/1, 2/1, and values between any two of the foregoing numbers. In some embodiments, in step (ii), the total flow rate of the rare gas and the treatment gas is 100 sccm to 5,000 sccm, and the temperature of the substrate is 50° C. to 650° C.

In some embodiments, the Si-containing precursor can be selected based on the target dielectric film and can be any precursor containing Si in its molecule as long as it can form a film on a substrate by cyclic deposition. For example, as the Si-containing precursor, for SiN film, methyldichlorosilane can be used, and for SiC film, disilabutane can be used. In some embodiments where the cyclic deposition is CVD, the Si-containing precursor contains silicon, halogen, and hydrocarbon in its molecule.

In some embodiments, steps (i) and (ii) are conducted continuously in the same chamber. In some embodiments, steps (i) and (ii) are conducted continuously in different chambers. In some embodiments, steps (i) and (ii) are conducted separately in different chambers.

In some embodiments, the dielectric film is constituted by SiC, SiN, or SiCN, which may further contain hydrogen.

Figure 2:
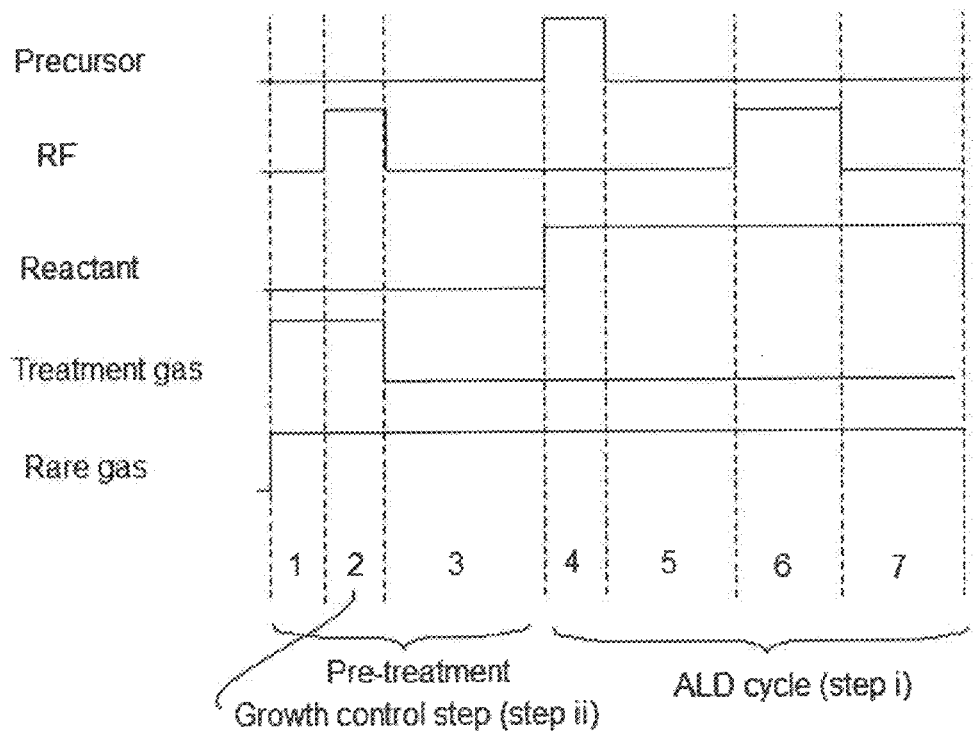
FIG. 2 shows process steps of a PE-ALD method for depositing a dielectric film according to an embodiment of the present invention.

FIG. 2 shows process steps of a PE-ALD method for depositing a dielectric film according to an embodiment of the present invention. In FIG. 2, the PE-ALD method repeats a cycle which is constituted by steps 4 to 7. In step 4 which is a precursor adsorption step, a precursor is supplied in a pulse, a reactant gas is supplied, and no RF power is applied. In step 5 which is a purge step, no precursor is supplied, the reactant gas is continuously supplied, and no RF power is applied. The reactant gas functions as a purge gas. In step 6 which is a surface reaction step, no precursor is supplied, the reactant gas is continuously supplied, and RF power is applied. In step 7 which is a purge step, no precursor is supplied, the reactant gas is continuously supplied, and no RF power is applied. The reactant gas functions as a purge gas. In this embodiment, a rare gas is continuously supplied throughout steps 1 to 7, which rare gas also functions as a purge gas. In some embodiments, in step 4, two or more precursors can be supplied in separate pulses or in the same pulse. In some embodiments, a separate purge gas can be used for purging, and vacuum can also be used for purging, wherein the reactant gas may be supplied only in step 7. Steps 5 and 7 can be conducted in any manner as long as the non-adsorbed precursor in step 5 and the non-reacted product in step 7 are removed from the surface. When two or more reactant gases are used, they may be supplied in different pulses, where neither reactant gas is continuously supplied, where RF power is applied in each step. For example, the first reactant gas is He and the second reactant gas is $NH_3$, thereby first forming SiC and then nitrizing SiC to form SiCN. Alternatively, the first reactant gas is $NH_3$ and the second reactant gas is He, thereby first forming SiN and then carbonizing SiN to form SiCN.

In some embodiments, the precursor is supplied using a carrier gas, wherein the precursor is vaporized in a tank under an equilibrium vaporization pressure, and the vaporized precursor is supplied with a carrier gas to a reactor, wherein the flow of the precursor is controlled by the inflow gas pressure (the pressure of gas flowing into the reactor). Since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby per cycle.

In some embodiments, the precursor is supplied together with a secondary precursor, such as hydrocarbon for films having Si—C bonds, in the same pulses.

In this embodiment, prior to the ALD cycle constituted by steps 4 to 7, a pre-treatment process constituted by steps 1 to 3 are performed. In step 1, a treatment gas and rare gas are supplied without supplying a precursor and reactant gas. In step 2, which is a growth control step, the gases are continuously supplied (the gas flows steps 1 and 2 constitute a pulse), and RF power is applied to excite the treatment gas and rare gas to treat the surfaces of the substrate, thereby interfering with chemisorption of the precursor in step 4 predominantly, selectively, or more likely on the top and bottom surfaces relative to the side wall so as to substantially match the chemisorption degree on the side wall with that on the top and bottom surfaces. In step 3, which is a purge step, only the rare gas is supplied as a purge gas, and no other gas is supplied, and no RF power is applied. In some embodiments, in step 3, a reactant gas can be supplied as a purge gas. Alternatively, the rare gas can be supplied together with the treatment gas in a pulse, instead of continuously supplying it throughout steps 1 to 7.

Figure 3:
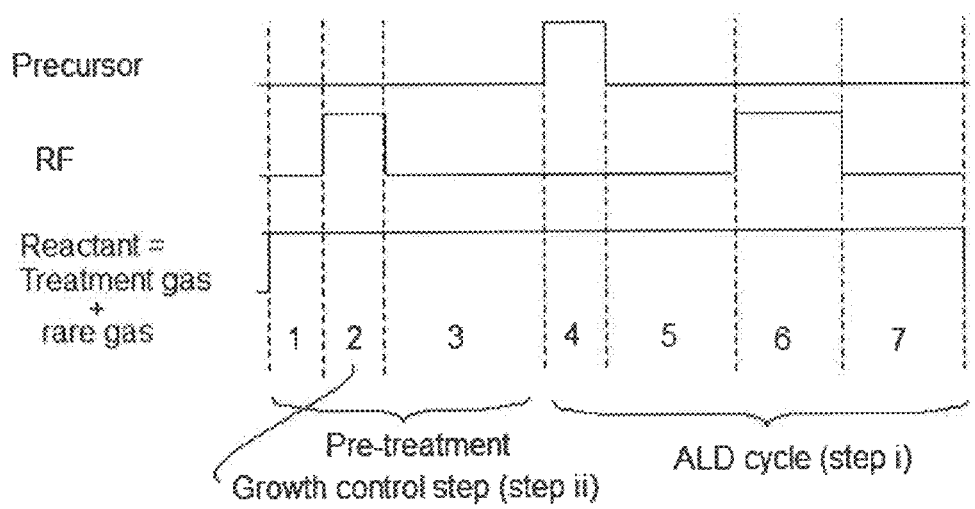
FIG. 3 shows process steps of a PE-ALD method for depositing a dielectric film according to another embodiment of the present invention.

In some embodiments, the reactant gas and the treatment gas are the same gas and can be continuously supplied throughout steps 1-7 as illustrated in FIG. 3. Alternatively, the reactant gas and the treatment gas can be supplied in a pulse as illustrated in FIG. 2, whereas the rare gas is supplied continuously as illustrated in FIG. 3.

In some embodiments, steps 4-7 may be conducted N times while steps 1 to 3 are conducted once in the beginning. In some embodiments, steps 1-7 (where steps 4-7 may be conducted N times) may be conducted M times. For example, the following sequence may be performed: steps 1-3→4 steps 4-7→4 steps 4-7→4 steps 4-7→4 steps 1-3→4 steps 4-7→4 steps 4-7→4 steps 4-7, where N is 3, and M is 2. M·N is constant and determined in order to obtain a target thickness of the dielectric film, and in some embodiments, N is 1 to 30,000, 1 to 3,000, 1 to 300, or 1 to 30.

In PE-ALD, in some embodiments, the following conditions may be employed:

ALD Cycle:

Substrate temperature: 0 to 650° C. (preferably about 100 to about 500° C.)

Precursor pressure: 50 to 1333 Pa (preferably about 100 to about 500 Pa, depending on the vapor pressure of the precursor)

Carrier gas (e.g., Ar or He) flow: 500 to 4,000 sccm (preferably about 1,000 to about 2,500 sccm)

Precursor pulse: 0.1 to 10 seconds (preferably about 0.3 to about 3 seconds)

Purge upon the precursor pulse: 0.1 to 10 seconds (preferably about 0.3 to about 3 seconds)

Optional purge gas flow: 100 to 2,000 sccm (preferably about 300 to 1,500 sccm)

RF frequency: 13.56 to 60 MHz

RF power: 10 to 1,500 W (preferably about 100 to about 800 W for a 300-mm wafer)

RF power pulse: 0.1 to 20 seconds (preferably about 0.5 to 10 seconds)

Reactant gas (rare gas) flow: 500 to 4,000 sccm (preferably, He flow at about 1,000 to 2,000 sccm)

Reactant gas (secondary gas) flow: 0 to 1,000 sccm (less than rare gas flow; preferably $H_2$ flow at about 50 to 500 sccm)

Reactant gas flow (for SiCN): 400 to 3,000 sccm (preferably N2 flow at about 500 to 1,500 sccm)

Purge upon the RF power pulse: 0.1 to 10 seconds (preferably about 0.3 to about 3 seconds)

Optional purge gas flow: 100 to 2,000 sccm (preferably about 300 to 1,500 sccm)

Duration of one cycle (except for the growth control step): 1 to 30 seconds

Number of cycles repeated: 300 to 1,000

Thickness of film: 5 to 30 nm

Pre-Treatment Process with Growth Control Step:

Substrate temperature: 0 to 650° C. (preferably about 100 to about 500° C.)

Precursor pressure: 50 to 1333 Pa (preferably about 100 to about 500 Pa)

Rare gas flow: 500 to 4,000 sccm (preferably, He flow at about 1,000 to about 2,000 sccm)

Treatment gas flow: 5 to 3,000 sccm (preferably $H_2$ flow at about 500 to about 1,000 sccm; for hydrocarbon, flow nt about 5 to about 100 sccm which is about 0.5% to about 5%)

Treatment gas pulse: 5 to 300 seconds (preferably about 5 to about 60 seconds) (The rare gas may be supplied together with the treatment gas or separately from the treatment gas in the same pulse as the treatment gas or may be continuously supplied.)

RF frequency: 13.56 to 60 MHz

RF power: 10 to 1,500 W (preferably about 100 to about 800 W for a 300-mm wafer)

RF power pulse (the duration of growth control step): 0.05 to 600 seconds (preferably about 0.1 to about 60 seconds) (The pulse typically begins after the treatment gas reaches the target surface, e.g., 1 to 10 seconds after the treatment gas flow begins.) (The ratio of the total duration of the growth control step to the total duration of the ALD cycles is typically about 1/100 to about 1/10, preferably about 1/50 to about 1/20.)

Purge upon the RF power pulse: 0.1 to 10 seconds (preferably about 0.3 to about 3 seconds)

Optional purge gas flow: 100 to 2,000 sccm (preferably about 300 to about 1,500 sccm)

Film can also be formed by thermal ALD or radical-enhanced ALD instead of plasma ALD, but plasma ALD is preferred in terms of productivity because thermal ALD requires a longer time for replacement reaction. Also, thermal reaction exhibits marked dependence on temperature and implementing it at low temperatures is difficult. Note that plasma ALD and thermal ALD are interchangeable in an embodiment despite their differences in productivity, etc.

Figure 4:
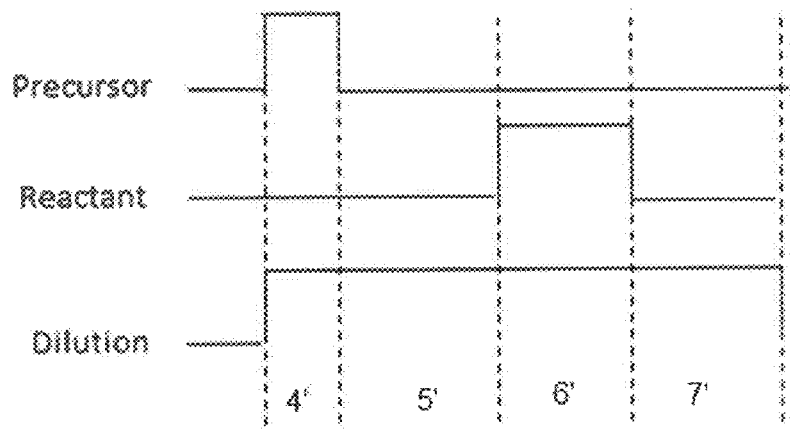
FIG. 4 shows process steps of a thermal ALD or radial-enhanced ALD method for depositing a dielectric film applicable to another embodiment of the present invention.

FIG. 4 illustrates process steps of a thermal ALD or radical-enhanced ALD method for depositing a dielectric film according to another embodiment of the present invention. In FIG. 4, the growth control step is omitted since the same step as steps 1 to 3 in FIG. 2 can be conducted. Steps 4', 5', 6', and 7' in FIG. 4 correspond to steps 4, 5, 6, and 7 in FIG. 2, respectively. In FIG. 4, the thermal ALD or radical-enhanced ALD method repeats a cycle which is constituted by steps 4' to 7'. In step 4' which is a precursor adsorption step, a precursor is supplied in a pulse, a dilution gas is supplied, and no reactant gas is supplied. In step 5' which is a purge step, no precursor is supplied, the dilution gas is continuously supplied, and no reactant gas is supplied. The dilution gas functions as a purge gas. In step 6' which is a surface reaction step, no precursor is supplied, the dilution gas is continuously supplied, and a reactant gas is supplied, which reactant gas is excited thermally or in a radical form generated in a remote plasma unit. In step 7' which is a purge step, no precursor is supplied, the dilution gas is continuously supplied, and no reactant gas is supplied. The dilution gas functions as a purge gas. In some embodiments, in step 4', two or more precursors can be supplied in separate pulses or in the same pulse. Steps 5' and 7' can be conducted in any manner as long as non-adsorbed precursor in step 5' and non-reacted product in step 7' are removed from the surface. When two or more reactant gases are used, they may be supplied in different pulses, where neither reactant gas is continuously supplied. For example, the first reactant gas is He and the second reactant gas is $NH_3$, thereby first forming SiC and then nitrizing SiC to form SiCN. Alternatively, the first reactant gas is $NH_3$ and the second reactant gas is He, thereby first forming SiN and then carbonizing SiN to form SiCN.

The sequence illustrated in FIG. 4 is similar to that illustrated in FIG. 2, except that in FIG. 2, the reactant gas is continuously supplied throughout steps 4 to 7 and RF power is applied only in step 6, whereas in FIG. 4, the dilution gas is continuously supplied throughout steps 4' to 7' and the reactant gas is supplied only in step 6'. The conditions for the sequence of FIG. 4 are similar to those for the sequence of FIG. 2. Additional conditions for thermal ALD are as follows:

Substrate temperature: 100° C. to 650° C. (preferably about 300 to about 550° C.)

For radical-enhanced ALD, reactant gas radicals supplied from a remote plasma unit are introduced to the reactor in place of the reactant gas.

Figure 5:
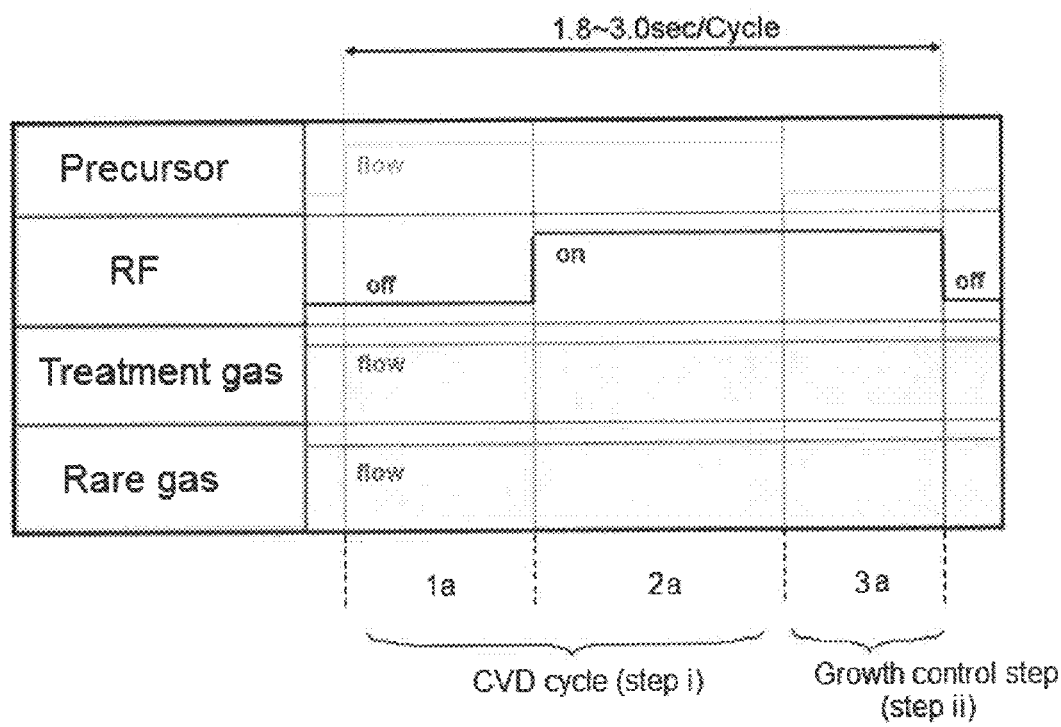
FIG. 5 shows process steps of a PE-CVD method for depositing a dielectric film according to another embodiment of the present invention.

Film can also be formed by cyclic CVD instead of plasma ALD. FIG. 5 illustrates process steps of a cyclic CVD method for depositing a dielectric film according to another embodiment of the present invention. In CVD, a reactant gas used for ALD is not required since reaction takes place in a reaction space, not on a surface. In FIG. 5, the cyclic CVD method repeats a cycle which is constituted by steps 1a and 2a. In step 1a which is a precursor supply step, a precursor is supplied in a pulse, a treatment gas and rare gas are supplied, and no RF power is applied. In step 2a which is an excitation step, the precursor is continuously supplied, the treatment gas and rare gas are continuously supplied, and RF power is applied. In some embodiments, in steps 1a-2a, two or more precursors can be supplied in separate pulses or in the same pulse. The treatment gas can be used as an additive gas for CVD, where two or more gases are used. For example, a first additive gas (rare gas) is He and a second reactant gas (treatment gas) is $NH_3$, thereby forming SiCN.

In this embodiment, after the CVD cycle constituted by steps 1a and 2a, a growth control step constituted by step 3a is performed. In step 3a, a treatment gas and rare gas are supplied without supplying a precursor, and during step 3a, RF power is applied to excite the treatment gas and rare gas to treat the surfaces of the substrate, thereby etching predominantly, selectively, or more likely the top and bottom surface relative to the side wall covered with film formed in steps 1a and 2a so as to substantially match deposition thickness on the side wall with that on the top and bottom surfaces.

In some embodiments, steps 1a-2a may be conducted N times while step 3a is conducted once at the end. In some embodiments, steps 1a-3a (where steps 1a-2a may be conducted N times) may be conducted M times. For example, the following sequence may be performed: steps 1a-2a→steps 1a-2a→steps 1a-2a→step 3a→steps 1a-2a→steps 1a-2a→steps 1a-2a→step 3a, where N is 3, and M is 2. M·N is constant and determined in order to obtain a target thickness of the dielectric film, and in some embodiments, N is 1 to 30,000, 1 to 3,000, 1 to 300, or 1 to 30.

In cyclic CVD, in some embodiments, the following conditions may be employed:

CVD Cycle:

Substrate temperature: 0 to 650° C. (preferably about 100 to about 500° C.)

Precursor pressure: 50 to 1333 Pa (preferably about 100 to about 500 Pa)

Carrier gas (e.g., Ar or He) flow: 500 to 4,000 sccm (preferably about 1,000 to about 2,500 sccm)

Precursor pulse: 0.1 to 3 seconds (preferably about 0.3 to about 1 seconds)

RF frequency: 13.56 to 60 MHz

RF power: 10 to 1,500 W (preferably about 100 to about 800 W for a 300-mm wafer)

RF power pulse: 0.5 to 5 seconds (preferably about 0.5 to 1 seconds)

Rare gas flow: 500 to 4,000 sccm (preferably, He flow at about 1,000 to about 2,000 sccm)

Treatment gas (additive gas) flow: 5 to 3,000 sccm (preferably $H_2$ flow at about 500 to about 1,000 sccm; for hydrocarbon, flow at about 5 to about 100 sccm which is about 0.5% to about 5%)

Treatment gas flow (additive gas flow) (for SiCN): 400 to 3,000 sccm (preferably $N_2$ flow at about 500 to 1,500 sccm)

Duration of one cycle: 1 to 30 seconds

Number of cycles repeated: 300 to 1,000

Thickness of film: 5 to 30 nm

Growth Control Step:

Substrate temperature: 0 to 650° C. (preferably about 100 to about 500° C.)

Precursor pressure: 50 to 1333 Pa (preferably about 100 to about 500 Pa)

Rare gas flow: 500 to 4,000 sccm (preferably, He flow at about 1,000 to about 2,000 sccm)

Treatment gas flow: 5 to 3,000 sccm (preferably $H_2$ flow at about 500 to about 1,000 sccm; for hydrocarbon, flow at about 5 to about 100 sccm which is about 0.5% to about 5%)

RF frequency: 13.56 to 60 MHz

RF power: 10 to 1,500 W (preferably about 100 to about 800 W for a 300-mm wafer)

RF power pulse (the duration of growth control step): 0.05 to 600 seconds (preferably about 0.1 to about 60 seconds) (The pulse is typically integrated with the pulse of RF power in the CVD cycle.) (The ratio of the total duration of the growth control step to the total duration of the CVD cycles is typically about 1/100 to about 1/10, preferably about 1/50 to about 1/20.)

FIG. 1 is a schematic view of a plasma ALD reactor/cyclic CVD reactor with flow control valves, which can be used in some embodiments of the present invention.

In this example, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz-500 kHz) 50 to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reaction gas and rare gas are introduced into the reaction chamber 3 through a gas flow controller 23, a pulse flow control valve 31, and the shower plate. Additionally, in the reaction chamber 3, an exhaust pipe 6 is provided through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). For the pulse flow control valve 31, a pulse supply valve that is used for ALD can suitably be used in some embodiments.

The disclosed embodiments will be explained with reference to specific examples which are not intended to limit the present invention. The numerical numbers applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLE

Method and Conditions

A dielectric film (SiN or SiC) was formed on a 300-mm substrate having a patterned surface having an aspect ratio of about 2 and an opening width of about 50 nm under the conditions shown below using the sequence illustrated in FIG. 2 for PE-ALD or the sequence illustrated in FIG. 5 for cyclic CVD and the apparatus illustrated in FIG. 1. The thickness of film was 30 nm for evaluating film properties. The conditions of PE-ALD for SiN film and SiC film and the conditions of cyclic CVD for SiC film were as follows:

PE-ALD for SiN

Comparative Example 1, Examples 1-2

Precursor: Dichlorotetramethyldisilane

Precursor inflow pressure: 133.3 Pa

Substrate temperature: 400° C.

Carrier gas flow: Ar at 2 SLM

Reactant gas flow: NH3 at 2 SLM

RF frequency: 13.56 MHz

RF power: 400 W

Precursor supply time (step 4): 2 seconds

Purge time after precursor pulse (step 5): 1 seconds

RF Plasma exciting time (step 6): 2 seconds

Purge time after RF application (step 7): 0.3 seconds

PE-ALD for SiC

Comparative Example 2, Examples 3-7

Precursor: 1,4-disilane

Precursor inflow pressure: 1333 Pa

Substrate temperature: 100° C./400° C.

Carrier gas flow: Ar at 2 SLM

Reactant gas flow: H2 and He at 2 SLM (H2/H=0.2/1.8)

RF frequency: 13.56 MHz

RF power: 400 W

Precursor supply time (step 4): 0.1 seconds

Purge time after precursor pulse (step 5): 1 seconds

RF Plasma exciting time (step 6): 1 seconds

Purge time after RF application (step 7): 0.3 seconds

Cyclic CVD for SiC

Example 8

Precursor: Tetrachlorodimethylsilane
Precursor inflow pressure: 66.6 Pa
Substrate temperature: 400° C.
Carrier gas flow: Ar at 2 SLM
Reactant gas flow: H2 at 0.5 SLM
RF frequency: 13.56 MHz
RF power: 400 W
Precursor supply time (steps 1a+2a): 2 seconds
RF Plasma exciting time (step 2a): 1.3 seconds The growth control step (step 2 in FIG. 2; step 3a in FIG. 5) was performed under conditions shown in Table 1. Incidentally, the duration of step 1 in FIG. 2 was 0.5 seconds, and the duration of step 3 in FIG. 2 was 0.5 seconds.

TABLE 1

| Film | Tem. (° C.) | Treatment gas | Rare gas | RF (W) | Duration (sec) | Pressure (Pa) | Cycles per growth control (N) | Total deposition cycles (M · N) |
|---|---|---|---|---|---|---|---|---|
| Com 1 | SiN | 400 | | | | | | | 500 |
| Ex 1 | SiN | 400 | H2: 1SLM | He: 1SLM | 500 | 60 | 400 | 500 | 500 |
| Ex 2 | SiN | 400 | H2: 1SLM | He: 1SLM | 500 | 0.1 | 400 | 1 | 500 |
| Com 2 | SiC | 400 | | | | | | | 500 |
| Ex 3 | SiC | 100 | H2: 0.5SLM | He: 1SLM | 500 | 60 | 300 | 500 | 500 |
| Ex 4 | SiC | 100 | H2: 0.5SLM | He: 1SLM | 500 | 0.2 | 300 | 1 | 500 |
| Ex 5 | SiC | 400 | NH3: 1SLM | He: 1SLM | 400 | 60 | 400 | 500 | 500 |
| Ex 6 | SiC | 400 | NH3: 1SLM | He: 1SLM | 400 | 0.1 | 400 | 1 | 500 |
| Ex 7 | SiC | 400 | CH4 0.01SLM | He: 1SLM | 400 | 60 | 400 | 500 | 500 |
| Ex 8 | SiC | 400 | H2: 0.5SLM | He: 1SLM | 500 | 0.2 | 300 | 1 | 500 |

Results

The films obtained above were examined, and the results are shown in Table 2.

TABLE 2

| | Sidewall coverage (%) | Bottom coverage (%) | GPC*1 (nm/cycle) | 100:1 DHF WER*2 (nm/min) |
|---|---|---|---|---|
| Com 1 | 80 | 90 | 0.05 | 1.5 |
| Ex 1 | 95 | 95 | 0.04 | 1.5 |
| Ex 2 | 93 | 92 | 0.03 | 1.4 |
| Com 2 | 75 | 92 | 0.15 | <0.01 |
| Ex 3 | 90 | 90 | 0.13 | <0.01 |
| Ex 4 | 91 | 89 | 0.1 | <0.01 |
| Ex 5 | 90 | 92 | 0.07 | <0.01 |
| Ex 6 | 90 | 93 | 0.06 | <0.01 |
| Ex 7 | 89 | 90 | 0.07 | <0.01 |
| Ex 8 | 89 | 88 | 0.05 | <0.01 |

*1GPC (Growth per cycle)
*2WER (Wet etch rate) using 1% DHF

In Comparative Example 1, the SiN film formed without the pre-treatment and with the growth control step demonstrated a sidewall coverage of 80% and a bottom surface coverage of 90% as shown in Table 2. Also, a SiN film was formed by PE-ALD using dichloroethylsilane (a chlorine-containing silane precursor) and NH3 (reactant) (not shown). However, its sidewall coverage was 85%. When treating the surfaces of the substrate with H2 gas and He gas prior to the ALD cycle, the sidewall coverage was improved by more than 10 percentage points as demonstrated in Examples 1 and 2, although the growth rate was reduced. The growth rate reduction occurred more on the top and bottom surfaces than on the sidewall, thereby improving the sidewall coverage. The films with the growth control step showed wet etch resistance equivalent to that of the film without the growth control step. In Example 1, the growth control step was conducted for 60 seconds one time, whereas in Example 2, the growth control step was conducted for 0.1 seconds 500 times (i.e., it was conducted in each ALD cycle) (the total was 50 seconds). Since the total duration of the ALD cycles was around 28 minutes, the ratio of the total duration of the growth control step to the total duration of the ALD cycles was 500 in Examples 1 and 2, respectively. The total duration of the growth control step exerted much more control over the sidewall coverage than did the frequency of the growth control step. By treating the surfaces with a hydrogen plasma, it is expected that the surfaces were chemically terminated with hydrogen, thereby inhibiting chemisorption of the precursor mainly on the horizontal surfaces (i.e., the top and bottom surfaces), rather than on the vertical surface (i.e., the sidewall).

In Comparative Example 2, the SiC film formed without the pre-treatment and with the growth control step demonstrated a sidewall coverage of 75% and a bottom surface coverage of 92% as shown in Table 2. When treating the surfaces of the substrate with H2 gas and He gas (Examples 3 and 4) or with NH3 gas and He gas (Examples 5 and 6) prior to the ALD cycle, the sidewall coverage was improved by more than 10 percentage points, although the growth rate was reduced. The growth rate reduction occurred more on the top and bottom surfaces than on the sidewall, thereby improving the sidewall coverage. The films with the growth control step showed wet etch resistance equivalent to that of the film without the growth control step. In Examples 3 and 5, the growth control step was conducted for 60 seconds one time, whereas in Examples 4 and 6, the growth control step was conducted for 0.2 seconds and 0.1 second, respectively, 500 times (i.e., it was conducted in each ALD cycle) (the total was 100 seconds and 50 seconds, respectively). Since the total duration of the ALD cycles was around 28 minutes, the ratio of the total duration of the growth control step to the total duration of the ALD cycles was 500 in Examples 3 and 5, 500 in Example 4, and 500 in Example 6. The total duration of the growth control step exerted much more control over the sidewall coverage than did the frequency of the growth control step. By treating the surfaces with a hydrogen plasma, it is expected that the surfaces were chemically terminated with hydrogen, thereby inhibiting chemisorption of the precursor mainly on the horizontal surfaces (i.e., the top and bottom surfaces), rather than on the vertical surface (i.e., the sidewall).

As with Examples 3-6, when treating the surfaces of the substrate with CH4 gas and He gas (Example 7) prior to the ALD cycle, the sidewall coverage was improved by more than 10 percentage points. By treating the surfaces with CH4, it is expected that both Si—C and Si—H were present and competing with each other, thereby inhibiting chemisorption of the precursor mainly on the horizontal surfaces (i.e., the top and bottom surfaces), rather than on the vertical surface (i.e., the sidewall).

Further, as demonstrated in Example 8, by using cyclic CVD, in place of PE-ALD, the film having characteristics similar to those of the films in Examples 3-7 was obtained.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of forming a dielectric film having Si—C bonds and/or Si—N bonds on a semiconductor substrate by cyclic deposition, which comprises:
   (i) conducting one or more cycles of cyclic deposition in a reaction space w herein a semiconductor substrate is placed, each cycle having a period supplying a Si-containing precursor and a reactant gas simultaneously, without RF power, and a period applying a pulse of RF power to the reaction space while supplying the reactant gas; and
   (ii) before or after step (i), but not during step (i), applying a pulse of RF power to the reaction space while supplying a rare gas and a treatment gas without supplying the Si-containing precursor,
   whereby a dielectric film having Si—C bonds, Si—N bonds, or Si—C and Si—N bonds is formed on the semiconductor substrate.

2. The method according to claim 1, wherein steps (i) and (ii) are repeated alternately to for the dielectric film.

3. The method according to claim 1, wherein the treatment gas in step (ii) is at least one gas selected from the group consisting of N-containing gases, H-containing gases, and C-containing gases.

4. The method according to claim 3, Wherein the treatment gas is at least one gas selected from the group consisting of $N_2$, $NH_3$, $N_xH_y$, $C_aH_b$, $C_aH_bN_c$, and $H_2$ wherein x, y, z, a, b, and c are integers.

5. The method according to claim 1, wherein in step (ii), the total flow rate of the rare gas and the treatment gas is 100 sccm to 5,000 sccm, and the temperature of the substrate is 50° C. to 650° C.

6. The method according to claim 1, wherein a ratio of the treatment gas flow to the rare gas flow is 0.001/1 to 10/1.

7. The method according to claim 1, wherein the duration of step (i) is T1, and the duration of step (ii) is T2, wherein T2/T1 is 0.01 to 0.1.

8. The method according to claim 1, wherein the cyclic deposition is atomic layer deposition (ALD).

9. The method according to claim 8, wherein the ALD is plasma-enhanced ALD, thermal ALD, or radical-enhanced ALD.

10. The method according to claim 8, wherein step (ii) is conducted before step (i).

11. The method according to claim 1, wherein the cyclic deposition is plasma enhanced CVD.

12. The method according to claim 11, wherein step (ii) is conducted after step (i).

13. The method according to claim 11, wherein the Si-containing precursor contains silicon, halogen, and hydrocarbon in its molecule.

14. The method according to claim 1, wherein the treatment gas and the reactant gas are the same gas.

15. The method according to claim 1, wherein steps (i) and (ii) are conducted continuously in sequence.

16. The method according to claim 1, wherein the semiconductor substrate has patterned recesses on which the dielectric film is formed, each patterned recess including a top surface, side wall, and bottom surface.

17. The method according to claim 16, wherein the dielectric film has a side wall coverage of over 85%, which is defined as a ratio of thickness of film deposited on the side wall to thickness of film deposited on the top surface.

18. The method according to claim 1, wherein the number of times steps (i) and (ii) are conducted is M, the number of cycles the cyclic deposition is conducted in step (i) is N, and M·N is constant and determined in order to obtain a target thickness of the dielectric film, wherein N is 1 to 30,000.

19. A method of forming, a dielectric film having Si—C bonds and/or Si—N bonds on a semiconductor substrate by cyclic deposition, which comprises:
   (i) conducting one or more cycles of cyclic deposition in a reaction space wherein a semiconductor substrate is placed, using a Si-containing precursor and a reactant gas; and
   (ii) before or after step (i), applying a pulse of RF power to the reaction space while supplying a rare gas and a treatment gas without supplying the Si-containing precursor,
   whereby a dielectric film having Si—C bonds, Si—N bonds, or Si—C and Si—N bonds is formed on the semiconductor substrate,
   wherein the semiconductor substrate has patterned recesses on which the dielectric film is formed, each patterned recess including a top surface, side wall, and bottom surface, and the dielectric film is formed as a first dielectric film wherein the duration of step (i) is T1, and the duration of step (ii) is T2, said method further comprising:
   determining a side wall coverage of the first dielectric film as a first side wall coverage, which side wall coverage is defined as a ratio of thickness of film deposited on the side wall to thickness of film deposited on the top surface; and
   conduct steps (i) and (ii) to form a second dielectric film having a second side wall coverage on a substrate using T2/T1 which is higher than T2/T1 used for the first dielectric film so as to render the second side wall coverage higher than the first side wall coverage, said second side wall coverage being over 85%.

20. The method according to claim 1, wherein the dielectric film is constituted by SiC or SiN.

* * * * *